United States Patent
Ziebarth et al.

(10) Patent No.: US 9,563,097 B2
(45) Date of Patent: Feb. 7, 2017

(54) DRIVER FOR ELECTROCHROMIC GLASS UNIT

(71) Applicant: Kinestral Technologies, Inc., South San Francisco, CA (US)

(72) Inventors: Jonathan Ziebarth, South San Francisco, CA (US); Howard S. Bergh, South San Francisco, CA (US)

(73) Assignee: Kinestral Technologies, Inc., South San Francisco, CA (US)

( * ) Notice: Subject to any disclaimer, the term of this patent is extended or adjusted under 35 U.S.C. 154(b) by 0 days.

(21) Appl. No.: 14/994,091

(22) Filed: Jan. 12, 2016

(65) Prior Publication Data
US 2016/0202590 A1    Jul. 14, 2016

Related U.S. Application Data

(60) Provisional application No. 62/102,504, filed on Jan. 12, 2015.

(51) Int. Cl.
*G02F 1/01* (2006.01)
*G02F 1/15* (2006.01)
(Continued)

(52) U.S. Cl.
CPC ............... *G02F 1/163* (2013.01); *B60R 1/088* (2013.01); *G02F 1/0123* (2013.01); *G09G 3/16* (2013.01);
(Continued)

(58) Field of Classification Search
CPC ........ G02F 1/01; G02F 1/0121; G02F 1/0123; G02F 1/15; G02F 1/153; G02F 1/155; G02F 1/1533; G02F 1/163; G02F 2001/1512; G02F 2001/1635; G09G 3/16; G09G 3/19; B60R 1/088; H01M 14/005
(Continued)

(56) References Cited

U.S. PATENT DOCUMENTS 4,420,749 A * 12/1983 Koyanagi ................ G09G 3/16
                                                          345/204
4,479,121 A * 10/1984 Tabata ..................... G09G 3/16
                                                          345/105
(Continued)

FOREIGN PATENT DOCUMENTS

WO    WO 98-16870    4/1998

OTHER PUBLICATIONS

International Search Report, PCT/US2016/013092, mailed May 25, 2016.

*Primary Examiner* — Loha Ben
(74) *Attorney, Agent, or Firm* — Womble Carlyle Sandridge & Rice LLP

(57) ABSTRACT

A method for controlling an electrochromic device is provided. The method includes applying a constant supply current to the electrochromic device and determining an amount of charge transferred to the electrochromic device, as a function of time and current supplied to the electrochromic device. The method includes ceasing the applying the constant supply current, responsive to a sense voltage reaching a sense voltage limit and applying one of a variable voltage or a variable current to the electrochromic device to maintain the sense voltage at the sense voltage limit, responsive to the sense voltage reaching the sense voltage limit. The method includes terminating the applying the variable voltage or the variable current to the electrochromic device, responsive to the determined amount of charge reaching a target amount of charge.

30 Claims, 10 Drawing Sheets

(51) Int. Cl.
*G02F 1/153* (2006.01)
*G02F 1/163* (2006.01)
*G09G 3/16* (2006.01)
*G09G 3/19* (2006.01)
*B60R 1/08* (2006.01)
*G02F 1/155* (2006.01)

(52) U.S. Cl.
CPC ............... *G09G 3/19* (2013.01); *G02F 1/0121* (2013.01); *G02F 1/155* (2013.01); *G02F 2001/1635* (2013.01)

(58) Field of Classification Search
USPC .......... 359/239, 245, 265, 267, 275; 345/48, 345/105; 706/61; 347/135, 255
See application file for complete search history.

(56) References Cited

U.S. PATENT DOCUMENTS

| | | | |
|---|---|---|---|
| 4,916,470 A * | 4/1990 | Kovacs | B41J 2/465 347/135 |
| 6,262,831 B1 * | 7/2001 | Bauer | B60R 1/088 359/264 |
| 6,449,082 B1 * | 9/2002 | Agrawal | G02F 1/155 250/214 SG |
| 6,614,577 B1 * | 9/2003 | Yu | G02F 1/163 351/44 |
| 6,618,181 B2 * | 9/2003 | Bauer | B60R 1/088 340/461 |
| 7,133,181 B2 | 11/2006 | Greer | |
| 7,215,318 B2 | 5/2007 | Turnbull et al. | |
| 8,018,644 B2 | 9/2011 | Gustavsson et al. | |
| 9,030,725 B2 | 5/2015 | Pradhan et al. | |
| 9,081,247 B1 | 7/2015 | Pradhan et al. | |
| 9,091,868 B2 * | 7/2015 | Bergh | G02F 1/0121 |
| 9,454,056 B2 | 9/2016 | Pradhan et al. | |
| 9,477,131 B2 | 10/2016 | Pradhan et al. | |
| 2003/0210450 A1 | 11/2003 | Yu et al. | |
| 2016/0139477 A1 | 5/2016 | Jack et al. | |
| 2016/0202588 A1 * | 7/2016 | Bass | G02F 1/155 359/265 |
| 2016/0203403 A1 * | 7/2016 | Nagel | H04L 51/32 706/61 |

* cited by examiner

DRIVER FOR ELECTROCHROMIC GLASS UNIT

FIELD OF INVENTION

The present disclosure generally relates to electrochromic devices, such as mirrors or windows, configured to cycle between optically less and more transmissive states and comprising a driver for controlling an electrochromic device, and a method for controlling electrochromic devices.

BACKGROUND

An electrochromic glass unit uses electrochromic glass that can change transmissivity with the application of electric current and voltage. The change of transmissivity typically relies on a reversible oxidation of a material. Electrochromic glass units can darken at the press of a button or other triggering event and are also often used in automobile rearview mirrors to reduce reflective glare. Controllers or drivers for electrochromic devices generally apply voltage and current of one polarity to charge the device and decrease optical transmissivity and the opposite polarity to discharge the device and increase the optical transmissivity.

The transmissivity change for current systems is relatively slow and non-uniform. Gradual, non-uniform coloring or switching is a common problem associated with large area electrochromic devices. This problem, commonly referred to as the "iris effect," is typically the result of the voltage drop through the transparent conductive coatings providing electrical contact to one side or both sides of the device. For example, when a voltage is initially applied to the device, the potential is typically the greatest in the vicinity of the edge of the device (where the voltage is applied) and the least at the center of the device; as a result, there may be a significant difference between the transmissivity near the edge of the device and the transmissivity at the center of the device. Over time, however, the difference in applied voltage between the center and edge decreases and, as a result, the difference in transmissivity at the center and edge of the device decreases.

In addition, the current systems tend not to be robust as desired. Faradaic losses in reversible electrochromic devices can degrade the performance of reversible electrochromic devices. These faradaic losses can, in turn, result in a corresponding change in the oxidation state of an electrochromic material in the electrochromic device. The faradaic losses can occur in the electrochromic material that becomes optically less transmissive in its electrochemically oxidized state, the electrochromic material that becomes optically less transmissive in its electrochemically reduced state, or both. Over time and repeated cycling, the accumulated faradaic losses can cause a drift in the range of optical transmissivities achievable for the device within the desired operating voltage range for the device. The change of oxidation state and cell potential within the device can change due to many factors such as leakage current, spurious oxidation of materials, and aging of components.

What is therefore desired is a driver for an electrochromic device that can provide a power supply for fast and uniform switching, and methods for doing so repeatedly in a variety of conditions. Furthermore, an electrochromic device driver and methods that provide functionality to improve the robustness of the system, is also desirable. It is within this context that the embodiments arise.

SUMMARY

In some embodiments, a method for controlling an electrochromic device is provided. The method includes applying a constant supply current to the electrochromic device and determining an amount of charge transferred to the electrochromic device, as a function of time and current supplied to the electrochromic device. The method includes ceasing the applying the constant supply current, responsive to a sense voltage reaching a sense voltage limit and applying one of a variable voltage or a variable current to the electrochromic device to maintain the sense voltage at the sense voltage limit, responsive to the sense voltage reaching the sense voltage limit. The method includes terminating the applying the variable voltage or the variable current to the electrochromic device, responsive to the determined amount of charge reaching a target amount of charge.

In some embodiments, an electronic driver for an electrochromic device is provided. The driver includes a power supply and a power supply control module configured to perform actions. The actions include supplying a constant current from the power supply to the electrochromic device and stopping the supplying the constant current when one of a sense voltage of the electrochromic device attains a sense voltage limit or an amount of charge transferred to the electrochromic device attains a target amount of charge. The actions include controlling one of a variable voltage or a variable current from the power supply to the electrochromic device to maintain the sense voltage at the sense voltage limit while the amount of charge transferred to the electrochromic device is less than the target amount of charge.

In some embodiments, an electronic driver for an electrochromic device is provided. The driver includes a voltage detecting circuit configured to measure a sense voltage of sense voltage terminals of the electrochromic device. The driver includes a reversible constant current supply configured to supply a constant current to the electrochromic device until one of the sense voltage achieves a sense voltage limit or an amount of charge transferred to the electrochromic device achieves a target amount of charge. The driver includes a reversible variable voltage supply configured to supply a variable voltage to the electrochromic device to keep the sense voltage at the sense voltage limit, responsive to the sense voltage achieving the sense voltage limit, until the amount of charge transferred to the electrochromic device achieves the target amount of charge.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A driver for electrochromic devices such as electrochromic glass is described below. The driver can charge and discharge an electrochromic device reliably, repeatedly and without exceeding a safe operating realm for the device. In order to do so, the driver can monitor a level of electric charge that is transferred to the electrochromic device, and provides a constant current to the electrochromic device so long as a sense voltage does not exceed a limit. If the sense voltage limit is reached the driver changes to a variable voltage, or a variable current, that is applied to keep the sense voltage at the sense voltage limit. The embodiments described in more detail below protect the electrochromic device from damage. In some cases, voltage and current application cease when the amount of charge transferred to the electrochromic device meets a target amount of charge. In some cases, this is when the electrochromic device is at, or assumed to be at, a target level of optical transmissivity. Various embodiments may have multiple power supplies or a single, more complex power supply, and have analog or digital components for determining charge transfer and controlling the power supply or supplies.

In most circumstances, the device maintains charge neutrality, and charge is merely moved from one electrode to the other. It follows that the amount of charge transferred to the device is the amount of electrons transferred to the device through one bus bar alone. During switching, electrons are transferred to the device through one bus bar, and an equivalent amount of electrons will be transferred from the device through the other bus bar to maintain charge neutrality. In some cases, the amount of charge transferred to the device will be defined as 0% when all of the transportable charge within the device resides in the anode, and 100% when all of the transportable charge within the devices resides in the cathode. Transportable charge is the amount of charge that can move in the system at a particular device voltage. Certain degradation mechanisms can increase or decrease the total transportable charge in the device (e.g., spurious oxidation), however, this excess charge will be periodically eliminated via the sequestration process (described more completely herein).

Figure 1:
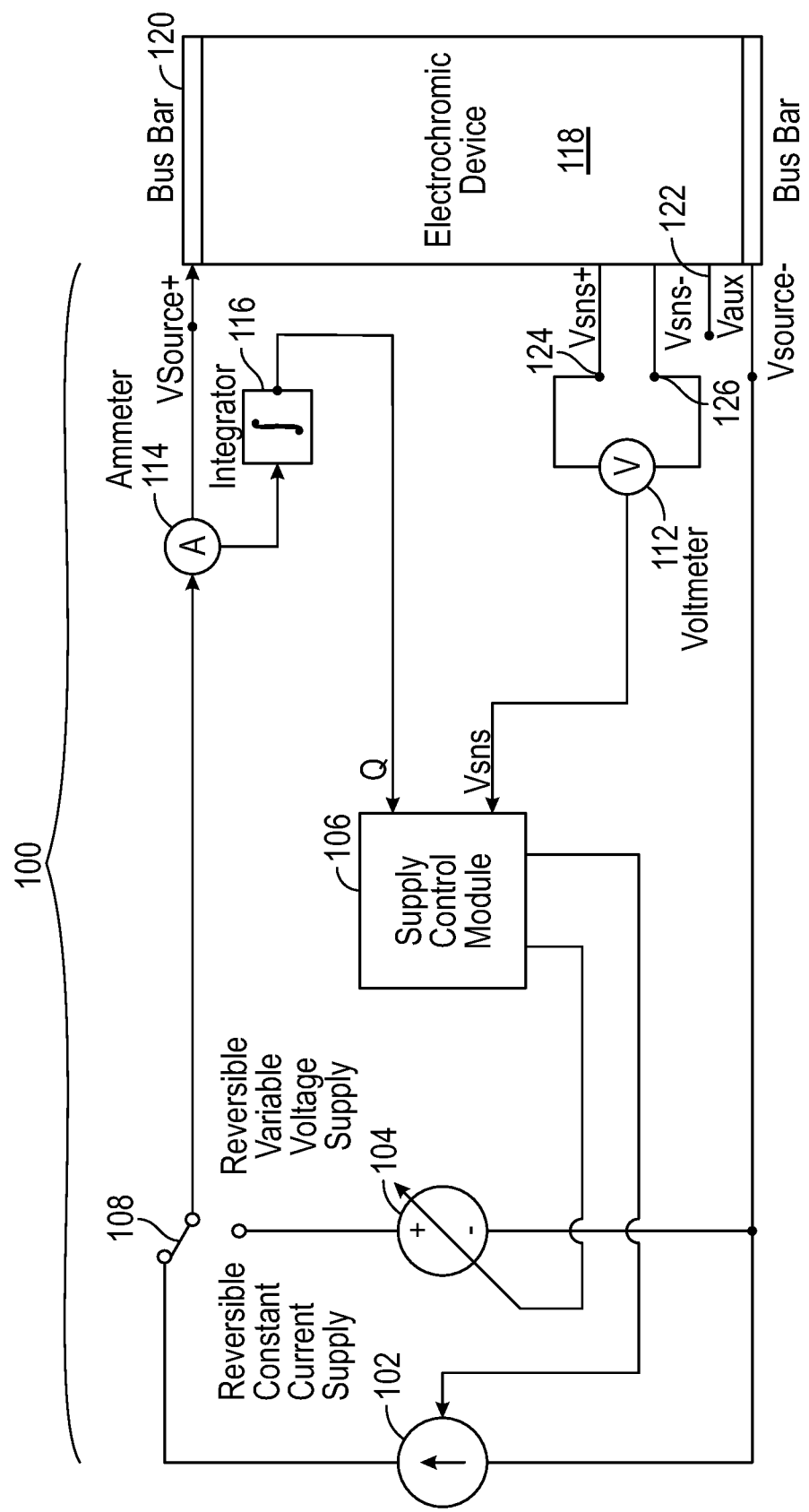
FIG. 1 is a system diagram of a driver and an electrochromic device, in accordance with an embodiment of the present disclosure.

FIG. 1 is a system diagram of a driver 100 and an electrochromic device 118, in accordance with some embodiments. The driver 100 applies a constant current from a reversible constant current supply 102 to the electrochromic device 118 during certain phases of operation, and applies a variable voltage from a reversible variable voltage supply 104 to the electrochromic device 118 during further phases of operation. Voltage and current are generally applied to the bus bars 120 of the electrochromic device 118, although in some embodiments of the electrochromic device 118, a charge sequestration terminal "SEQ" (labeled Vaux) 122 is available for further operation, e.g., to sequester charge. In the embodiment shown, one of the bus bars 120 is labeled "VSOURCE+" and another one of the bus bars 120 is labeled "VSOURCE−", so that polarity of the reversible constant current supply 102 and polarity of the reversible variable voltage supply 104 can be determined relative to the bus bar 120 connections. It should be appreciated that the term "reversible" refers to the polarity of the current from the reversible constant current supply 102 as being able to be reversed, so that the reversible constant current supply 102 provides current for either charging or discharging the electrochromic device 118. Similarly, polarity of the voltage from the reversible variable voltage supply 104 can be reversed, so that the reversible variable voltage supply 104 provides a variable amount of voltage (or current) for either charging or discharging the electrochromic device 118. Voltage and current of a first polarity are supplied for charging the electrochromic device 118 towards a first transmissivity, and voltage and current of a second polarity are supplied for discharging the electrochromic device 118 towards a second transmissivity.

In certain cases, the electrochromic device includes, in succession, a first substrate, a first electrically conductive layer, a first electrode, an ion conductor, a second electrode, a second electrically conductive layer, and a second substrate. The two bus bars 120 depicted in FIG. 1 can be electrically connected to the two electrically conductive layers, and therefore one bus bar 120 is associated with one electrode (e.g. the anode) and the other bus bar 120 is associated with the other electrode (e.g. the cathode).

A voltmeter 112 measures a sense voltage, labeled "Vsns", at the sense voltage terminals 124, 126 of the electrochromic device 118. One of the sense voltage terminals 124 is labeled "VSNS+", and another one of the sense voltage terminals 126 is labeled "VSNS−", so that polarity of a measurement of the sense voltage can be determined relative to the sense voltage terminals 124, 126. Other labels are readily devised. In the embodiment shown, the sense voltage terminals 124, 126 are distinct from the bus bars 120, and are located elsewhere than a location of the bus bars 120. A sense voltage terminal 134 could be connected to an interior region of the electrochromic device 118, or various sense voltage terminals 124, 126, 128, 130, 132 could be located along an edge of the electrochromic device 118. Edge locations may be preferable for a gradient type of electrochromic device 118, in which a transmissivity gradient is produced from top to bottom, bottom to top, left to right, right to left or other arrangement. Interior locations may be preferable to detect whether a bull's-eye effect is present. For example, a sense voltage could be taken across an upper region, a middle region, or a lower region of the electrochromic device 118 through suitable terminals, e.g., pairs of sense voltage terminals 124, 126, 128, 130, 132, and 134. Alternatively, a sense voltage could be taken from a sense voltage terminal 124, 126, 128, 130, 132, 134 relative to one of the bus bars 120. In some cases, the two or more sense voltage terminals (e.g., 124 and 126) are electrically connected to the two electrodes of the device (i.e., the anode and cathode).

Sense voltage terminals located at certain spatial locations of the device would provide a measurement of the cell potential (i.e., voltage between the anode and cathode) of the device at a those spatial locations. In some cases, each sense voltage terminal is designed to have a minimal voltage drop between the electrode (i.e. anode or cathode) and the voltmeter 112. The impedance of the sense circuit between the electrodes and the voltmeter 112 can be high, which will make the reading at the voltmeter 112 be close to the actual voltage condition of the electrode location near the sense voltage terminal. In order to measure a specific location within the device, each sense voltage terminal connections to the electrodes (i.e., anode and cathode) can be electrically isolated from the electrically conductive layers. Electrical isolation of each sense terminal can be beneficial because the electrically conductive layers will provide low resistance connections to many locations of the electrodes.

A pair of sense voltage terminals can be connected to the two electrodes (i.e. anode and cathode) in the same or different locations, when viewed from above. In some cases, one sense voltage terminal is at one location on one electrode, and a second sense voltage terminal is located directly above the first on the other electrode. In some cases, one sense voltage terminal is at one location on one electrode, and a second sense voltage terminal is on the other electrode at a different location that has approximately the same cell potential.

In some cases the sense voltage terminals can be directly connected to the bus bars. In other words, one or both of the sense voltage terminals 124 and/or 126 in FIG. 1 could connect to one or both bus bars 120. In some cases, sense voltage terminal 124 is connected to a bus bar 120 associated with one electrode, and the other sense voltage terminal 126 is connected to the other electrode at a location other than a bus bar 120.

In some cases, there are two or more sets of sense voltage terminals, with each set having two sense voltage terminals, where one is electrically connected to one electrode and the other is electrically connected to the other electrode. More than one set allows two independent measurements of the open circuit voltage to be obtained and compared with each other. This is beneficial since in such examples there is a fail-safe, or redundancy, in the system to protect the system from errors or damaged connections associated with one or more sense voltage terminals.

Ammeter 114 measures current supplied to the electrochromic device 118. In the embodiment shown, the ammeter 114 is in line with the VSOURCE+ bus bar 120, although in further embodiments the ammeter 114 could be in line with the VSOURCE− bus bar 120.

Still referring to FIG. 1, integrator 116 receives the output of the ammeter 114, and integrates this over time to produce a value "Q", which is equal to, proportional to, related to, or represents the amount of charge transferred to the electrochromic device 118 over a span of time. The integrator 116 and the ammeter 114 perform a calculation that determines the total amount of charge as equal to or related to the integral of the current into the electrochromic device 118 from a first time to a second time, i.e., over a span of time or a time interval. It should be appreciated that the polarity of the charge, the polarity of the current and the polarity of the voltage are interrelated, and that a negative amount of charge transferred to the electrochromic device 118 is equivalent to a positive amount of charge transferred from the electrochromic device 118, and a positive amount of charge transferred to the electrochromic device 118 is equivalent to a negative amount of charge transferred from the electrochromic device 118, in some embodiments. The phrase "charge transferred to the electrochromic device 118" can be descriptive of both charging and discharging the electrochromic device 118.

Continuing with FIG. 1, a supply control module 106 receives the charge value "Q" from the integrator 116, receives the sense voltage from the voltmeter 112, and controls the reversible constant current supply 102, the reversible variable voltage supply 104, and a switch 108. The switch selects either the reversible constant current supply 102 or the reversible variable voltage supply 104 and couples the selected power supply to the electrochromic device 118. In the embodiment shown, the switch 108 connects the selected power supply to the ammeter, which is in line with one of the bus bars 120. In further embodiments, the switch could connect the selected power supply directly to the bus bar 120. The supply control module 106 determines, based on the charge value and the sense voltage, whether to apply current or voltage, and the polarity of current or voltage to apply to the electrochromic device 118. Also, the supply control module 106 determines a target amount of charge to be transferred to the electrochromic device 118 based on the difference between the present transmissivity, or assumed transmissivity, of the electrochromic device 118 and a target transmissivity of the electrochromic device 118 in some embodiments. These functions can be accomplished with tables, algebraic calculations, and/or various algorithms in various embodiments as readily devised in accordance with some embodiments. One example of a relationship between optical transmission state and transferred charge for an exemplary EC device is $T2=T1*10^{(-CE*deltaQ)}$, where T1 is current transmission state, T2 is target transmission state, CE is coloration efficiency (in the units of (optical density$*cm^2$)/C), and deltaQ is the amount of charge to be transferred to change from state T1 to state T2 (in units of $C/cm^2$). For instance, in an exemplary device with a CE of 50 optical density$*cm^2$/C, to change from a state of 90% transmission to 5% transmission would require roughly 25 $mC/cm^2$ be transferred. Various processes and phases of operation of driver 100 are further described below with reference to FIGS. 2-6.

Figure 6:
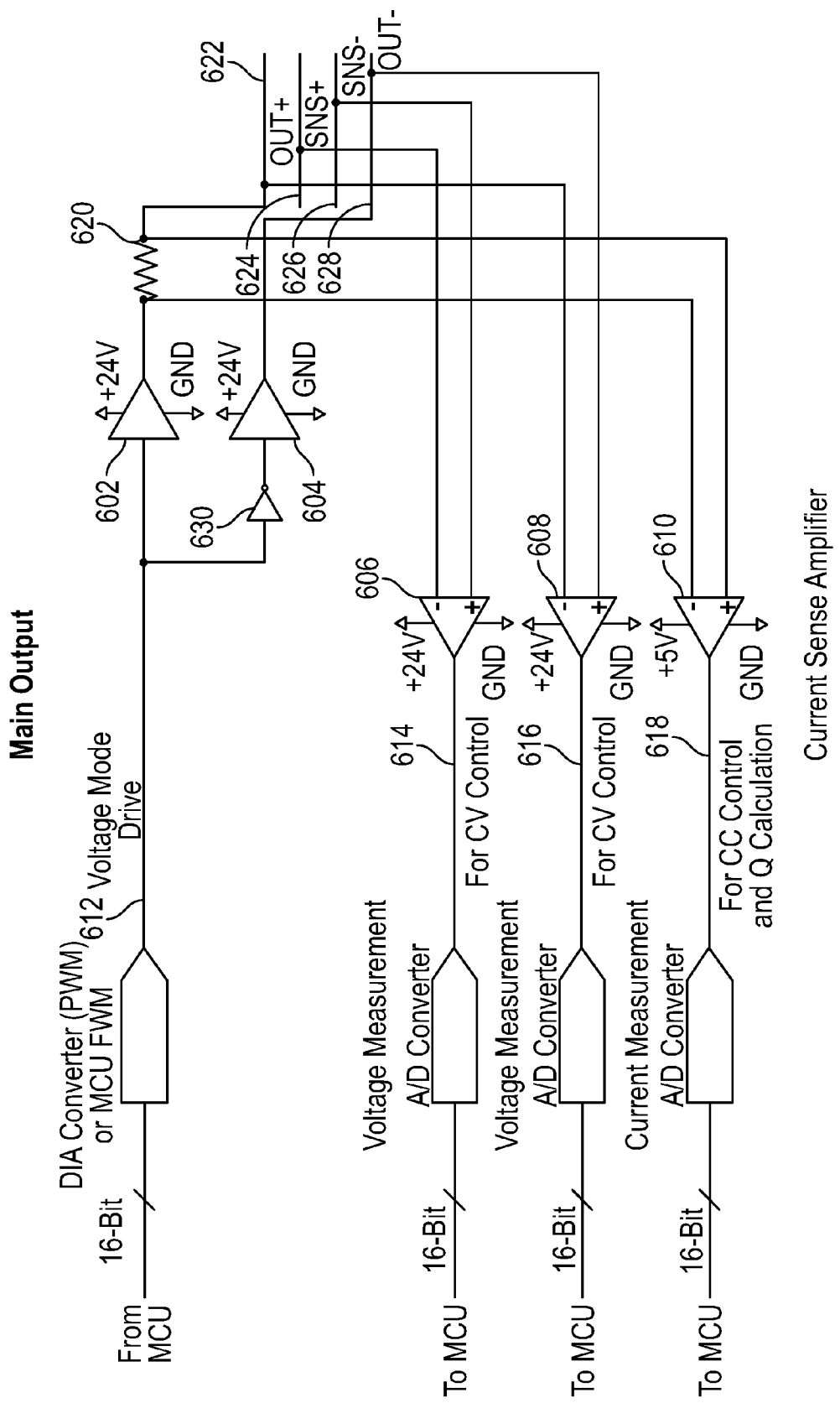
FIG. 6 is a circuit diagram of a power supply and voltage sensing circuit, which are suitable for use in the driver of FIG. 1 to charge and discharge the electrochromic device.
Figure 7:
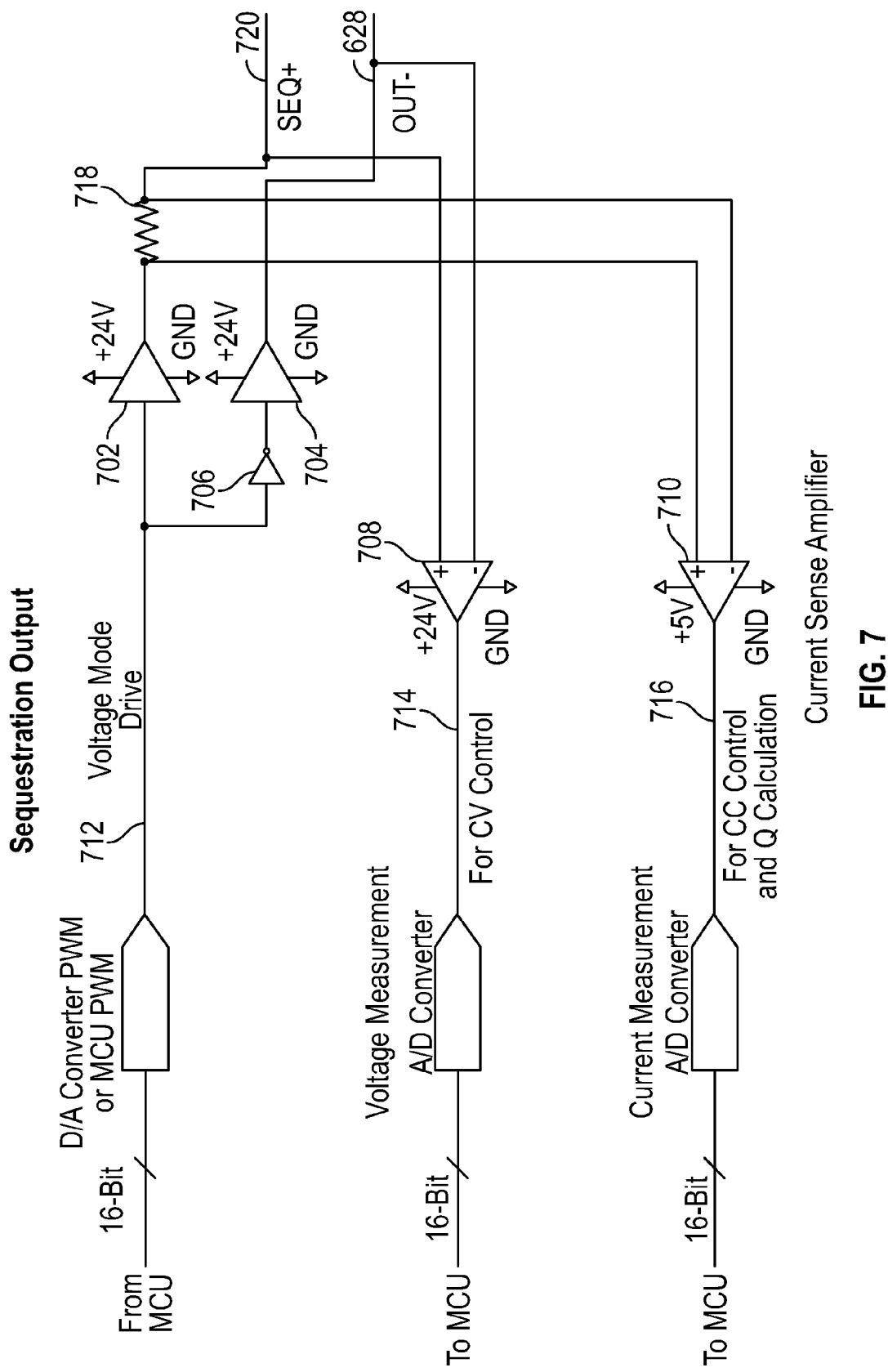
FIG. 7 is a circuit diagram of a further power supply and voltage sensing circuit, which are suitable for use in the driver of FIG. 1 to sequester charge in the electrochromic device.

It should be appreciated that the embodiment illustrated in FIG. 1 of the driver is not meant to be limiting. For example, the reversible constant current supply 102, the reversible variable voltage supply 104 and the switch 108 could be combined in a single, more complex power supply in some embodiments. This power supply is capable of supplying constant current, variable voltage, and reversing polarity in some embodiments. Alternatively, the reversible constant current supply 102 could be implemented as a single polarity constant current supply, with switches for reversing the polarity. The reversible variable voltage supply 104 could be implemented as a single polarity variable voltage supply, with switches for reversing the polarity. The reversible current supply 102 can also be a reversible variable current supply in some cases. The switch 108, or other switches in various embodiments of power supplies, could be implemented using relays, solid-state switches, or modes of operation of one or more power supplies. Further examples of power supplies are illustrated in FIGS. 6 and 7. The voltmeter 112 could be implemented using an analog-to-digital converter in some embodiments. The ammeter 114 could be implemented using a low resistance value resistor and an analog-to-digital converter, a Hall effect sensor, an inductive sensor or other sensor, with or without an analog-to-digital converter, or various further devices for detecting current.

The integrator 116 could be an analog integrator, for example based on an operational amplifier with a capacitor in a feedback loop. In some embodiments, the integrator 116 could include a digital adder or arithmetic logic unit, such as found in digital signal processors. In digital embodiments, the integrator 116 could be implemented as a time-series summation of digitally converted values of the current supplied to the electrochromic device. A digital signal processor, or a microprocessor or a controller could be applied to perform such calculations and may be included in the supply control module 106. For example, a digital signal processor or a microprocessor with on-chip analog-to-digital conversion could implement the current sensing, the voltage sensing and the integration, as well as the control algorithms applied to the power supply or supplies. In some embodiments, the analog-to-digital converter could be separate from the digital signal processor or the microprocessor. Various further combinations of analog circuitry, digital circuitry, state machines and/or software programming, discrete components, system-on-chip, etc. are readily devised in keeping with the teachings disclosed herein.

Figure 2:
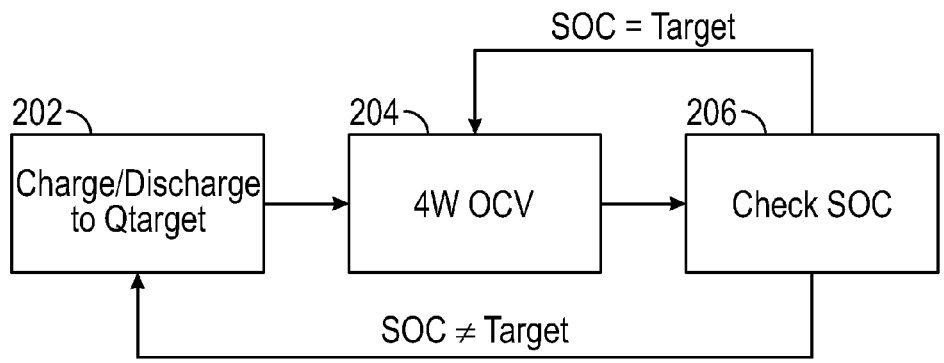
FIG. 2 is a process diagram depicting operation of the driver of FIG. 1.

FIG. 2 is a process diagram depicting operation of the driver 100 of FIG. 1 in accordance with some embodiments. The process diagram of FIG. 2 assumes the driver 100 has determined to change the transmissivity of the electrochromic device. Such determination could be a result of a user selection, a schedule, a detection, a rule-based process, an artificial intelligence learning process of the driver 100, etc. To initiate changing the transmissivity of the electrochromic device, the driver 100 performs a charge/discharge to Qtarget process 202. In process 202, the driver 100 charges the electrochromic device towards a desired transmissivity, or discharges the electrochromic device towards a desired transmissivity. This process transfers charge to the electrochromic device. A target amount of charge (i.e., Qtarget) to have in the electrochromic device is determined, based on a targeted transmissivity of the electrochromic device. The target amount of charge to be transferred is determined based on a difference between a present amount of charge in the electrochromic device and the target amount of charge to have in the electrochromic device in some embodiments. The driver 100 monitors the amount of charge being transferred to the electrochromic device, using the charge determination mechanisms described above (e.g., the integrator). When the amount of charge transferred to the electrochromic device equals the target amount of charge to be transferred, the driver 100 terminates the charge/discharge to Qtarget process 202, and starts the four wire open circuit voltage (4 W OCV) process 204. In further embodiments, a three wire process, or a process using more than four wires, can be used. The total number of wires in the interface between the driver 100 and the electrochromic device 118 includes the two wires supplying charge to the bus bars 120 and one, two, or more sense voltage lines, for measuring sense voltage of the electrochromic device 118.

In the four wire open circuit voltage process 204, the driver 100 measures the open circuit voltage across the sense voltage terminals 124, 126 of the electrochromic device 118 (see FIG. 1). In further embodiments, the driver 100 measures the open circuit voltage from one sense voltage terminal 124, 126, 128, 130, 132, 134 to one bus bar 120, or across other pairs of sense voltage terminals 124, 126, 128, 130, 132, 134. The driver 100 then performs the check state of charge (Check SOC) process 206. In the check state of charge process 206, the driver 100 determines a state of charge of the electrochromic device, based on the measured open circuit voltage across the sense voltage terminals, i.e. the sense voltage. The sense voltage relaxes over time after the charging or discharging ceases. Relaxation time, and relaxation amount of voltage can be established through characterization of the electrochromic device, simulation or other techniques. Satisfactory deviation voltage from a relaxed sense voltage can also be determined similarly. The check state of charge process 206 determines whether the state of charge is equal to a target state of charge, based on the above parameters. For example, if the sense voltage, after a relaxation time, and after relaxing by a relaxation amount of voltage, remains within the satisfactory deviation voltage from the relaxed sense voltage, the driver 100 determines that the state of charge of the electrochromic device equals the target state of charge. The process flow would then loop between the four wire open circuit voltage process 204 and the check state of charge process 206. If the sense voltage does not remain within the satisfactory deviation voltage from the relaxed sense voltage, the driver 100 determines that the state of charge of the electrochromic device does not equal the target state of charge. The process flow would then proceed to the charge/discharge to Qtarget process 202, in order to bring the state of charge of the electrochromic device to the target state of charge of the electrochromic device.

Figure 3:
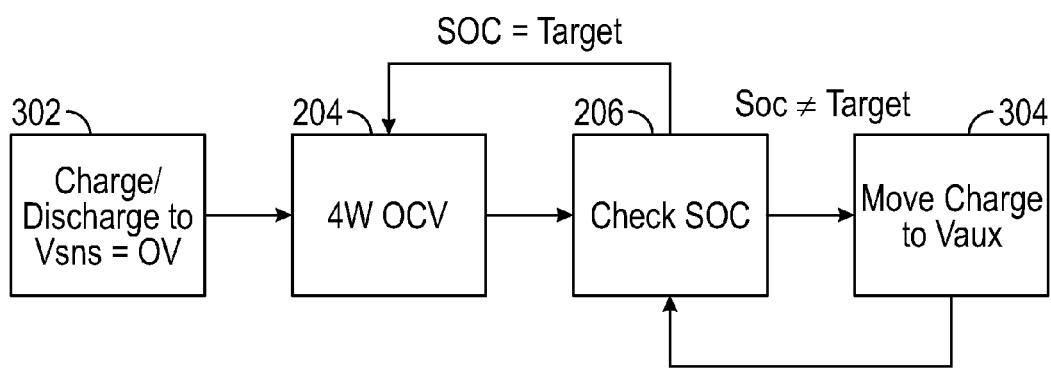
FIG. 3 is a process diagram depicting further operation of the driver of FIG. 1.

FIG. 3 is a process diagram depicting further operation of the driver 100 of FIG. 1 in accordance with some embodiments. The process diagram of FIG. 3 assumes the driver 100 has determined to completely charge or discharge the electrochromic device to a sense voltage of zero volts, to attain maximum transmissivity of the electrochromic device (or minimum transmissivity, for some embodiments of an electrochromic device). This could occur for similar reasons or circumstances as the invocation of the process diagram of FIG. 2. In this state, it is also possible to re-zero the driver 100 as to the state of charge of the electrochromic device. At full discharge of the electrochromic device, the state of charge of the electrochromic device is considered nominally at zero, in some embodiments. It should be appreciated that the calculation and tracking of the state of charge of the electrochromic device through the driver 100 is subject to cumulative small errors as a result of measurement accuracy, noise, drift, leakage, aging of components, etc., and that re-zeroing of the driver 100 can restore accuracy of the tracking of the state of charge of the electrochromic device.

Still referring to FIG. 3, to initiate changing the transmissivity of the electrochromic device to maximum transmissivity (or minimum transmissivity, for some embodiments of an electrochromic device), the driver 100 performs a charge/discharge to a sense voltage of zero volts (Vsns=0V) in process 302. In some embodiments, this corresponds to discharging the electrochromic device to Qtarget=0, i.e., a nominal zero state of charge in the electrochromic device. In some embodiments, this is accomplished by determining an amount of charge to be transferred to the electrochromic device, monitoring the amount of charge transferred to the electrochromic device, and stopping the transfer of charge when the amount of charge transferred to the electrochromic device equals the target amount of charge to be transferred. In other cases, the transfer of charge is stopped after a set time duration elapses. The four wire open circuit voltage process 204 (or variation thereof, as mentioned above) measures the sense voltage, and the check state of charge process 206 determines whether the state of charge is equal to the target amount of charge in the electrochromic device.

In this situation, the target is zero, which should correspond to a zero state of charge. If the state of charge matches the target state of charge, the process flow loops between the four wire open circuit voltage process 204 and the check state of charge process 206. If the state of charge does not match the target state of charge, then in some cases, process 304 is initiated where the charge is moved to SEQ (i.e., the charge sequestration terminal 122). If the state of charge does not match the target state of charge, then in some other cases, the charge counter is re-zeroed, and then process 304 is initiated where the charge is moved to SEQ (i.e., the charge sequestration terminal 122). If the state of charge does not match the target state of charge, then in some other cases, process 304 is initiated where the charge is moved to SEQ (i.e., the charge sequestration terminal 122), and then the charge counter is re-zeroed. Upon completion, flow branches back to the check state of charge process 206.

In another set of embodiments, the charge counter can be re-zeroed and/or charge can be moved to SEQ when the charge does match the target state of charge. If the state of charge does match the target state of charge, then in some cases, process 304 is initiated where the charge is moved to SEQ (i.e., the charge sequestration terminal 122). If the state of charge does match the target state of charge, then in some other cases, the charge counter is re-zeroed, and then process 304 is initiated where the charge is moved to SEQ (i.e., the charge sequestration terminal 122). If the state of charge does match the target state of charge, then in some other cases, process 304 is initiated where the charge is moved to SEQ (i.e., the charge sequestration terminal 122), and then the charge counter is re-zeroed.

It should also be appreciated that, in the process depicted in FIG. 3, for some materials/devices, Vsns could be set to −0.5V or Vsns can be set to 0.5V in some embodiments to run the protocol described herein. Other ranges may be utilized with the embodiments, as the protocol described herein for setting Vsns to check the state of the charge of the device is one example and not meant to be limiting.

In sequestration process 304 where the charge is moved to SEQ, charge is moved from one of the bus bars 120 to the charge sequestration terminal 122 (SEQ) of the electrochromic device. This could be performed by coupling one of the bus bars 120 (e.g., an anode or a cathode) of the electrochromic device to one of the output terminals of the driver 100 and coupling the charge sequestration terminal 122 of the electrochromic device to another one of the output terminals of the driver 100. The driver 100 would then be operated so as to charge or discharge the charge sequestration terminal 122 of the electrochromic device relative to the selected one of the bus bars. This operation sequesters charge and/or regenerates the zero state of charge in the electrochromic device, by transferring charge from a main portion of the electrochromic device to a secondary sequestration portion of the electrochromic device, which is accessed via the charge sequestration terminal 122.

Figure 4:
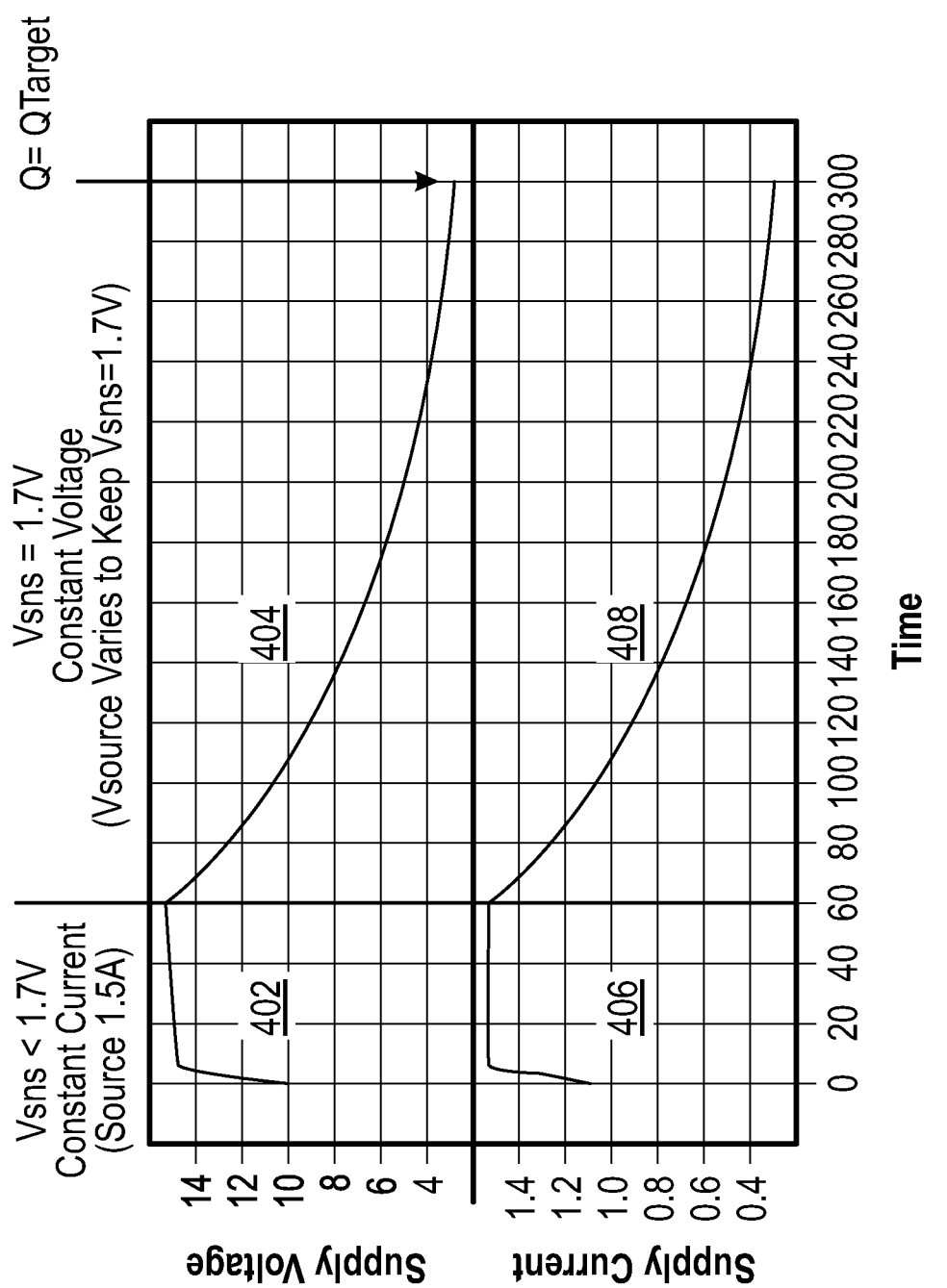
FIG. 4 is a voltage and current versus time graph depicting charging the electrochromic device with the driver of FIG. 1.

FIG. 4 is a voltage (in volts) and current (in amps) versus time graph depicting charging the electrochromic device with the driver 100 of FIG. 1 in some embodiments. Four regions 402, 404, 406, 408 are shown in the graph. Two of the regions 402, 404 depict supply voltage versus time, and two of the regions 406, 408 depict supply current versus time. The horizontal axis is in seconds of time. The example is for a specific electrochromic device, e.g. a window, and may differ for other electrochromic devices and various dimensions of variations of the electrochromic device. Illustrated in the graph of FIG. 4, there is an initial, upward spike in both supply voltage and supply current, from time T=zero, for the first few seconds of operation. In the region 406, constant current is applied up until about sixty seconds of time. The voltage rises slightly, from about 14½ V (volts) to about 15 V during this time, as seen in the region 402. In the constant current region 402, 406, the sense voltage is less than a target sense voltage of 1.7 V, and the constant current source provides about 1½ A (amps) to the electrochromic device 118.

Continuing with FIG. 4, at time T=sixty seconds, the sense voltage reaches the target sense voltage of 1.7 V, and the driver 100 switches from constant current to a variable voltage or a variable current to maintain the sense voltage at 1.7 V. In the region 404, the supply voltage is observed to drop from about 15 V down to about 3 V over the next four minutes (e.g., from sixty seconds to three hundred seconds), as the sense voltage is maintained at a constant voltage equal to the target sense voltage. In the region 408, the supply current is observed to drop from about 1.5 A down to about 0.2 A (i.e., about 1½ A down to about ⅕ A), again while maintaining the sense voltage at a constant voltage. The sense voltage can be maintained at the target sense voltage by controlling a variable voltage applied to the bus bars of the electrochromic device in some embodiments. Alternatively, the sense voltage can be maintained at the target sense voltage by controlling a variable current applied to the bus bars of the electrochromic device. At time T=three hundred seconds, the right end of the graph, the charge in the electrochromic device has reached the target charge Qtarget, and the driver 100 stops supplying the variable voltage (or the variable current) to the electrochromic device. In other words, the driver 100 ceases supplying voltage and current to the electrochromic device. The four wire open circuit voltage process 204 and the check state of charge process 206 can then take place (see FIGS. 2 and 3). In other cases, the transfer of charge can be stopped after a set time duration elapses.

Figure 5:
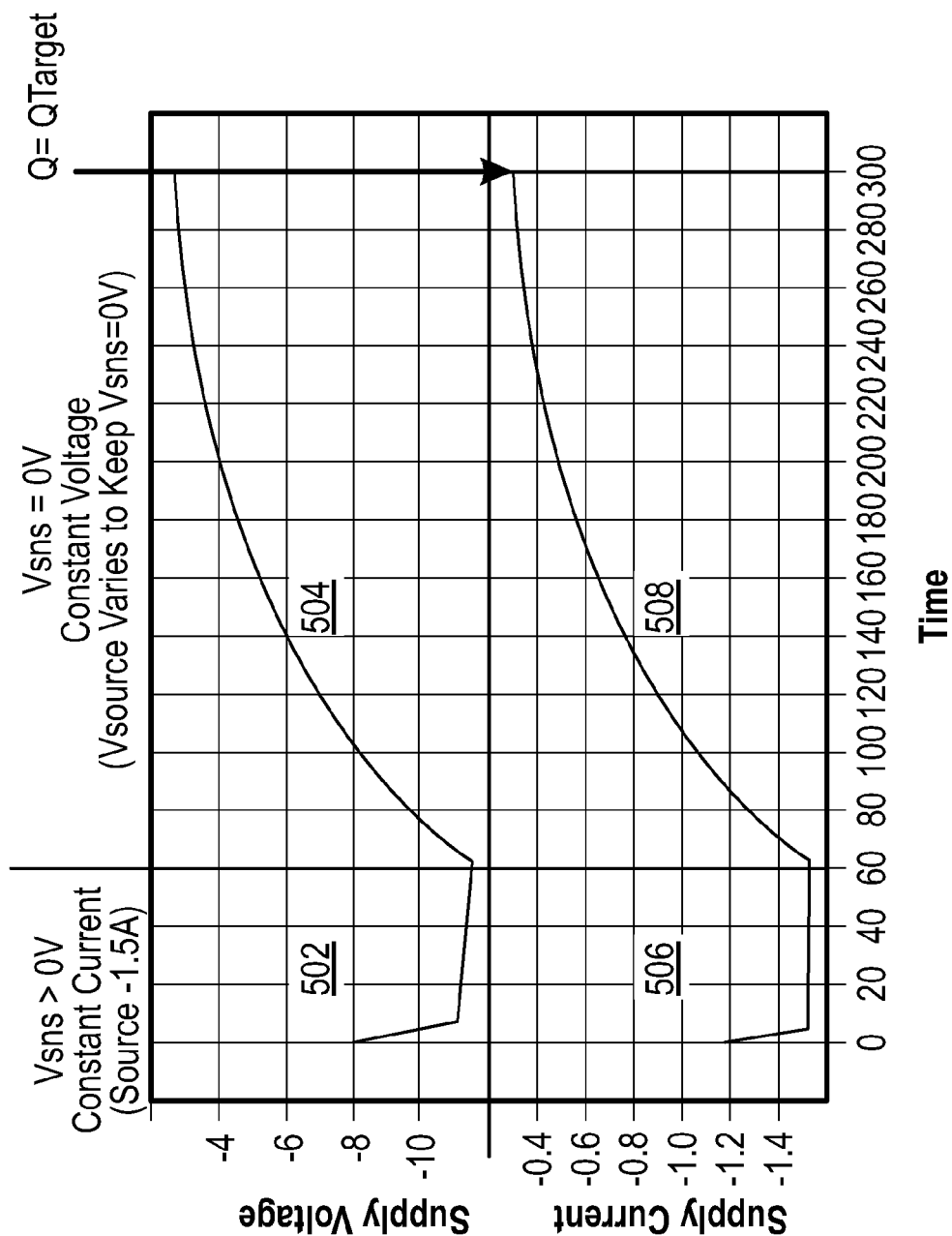
FIG. 5 is a voltage and current versus time graph depicting discharging the electrochromic device with the driver of FIG. 1.

FIG. 5 is a voltage (in volts) and current (in amps) versus time (in seconds) graph depicting discharging the electrochromic device with the driver 100 of FIG. 1 in some embodiments. The graph of FIG. 5 appears inverted as compared to the graph of FIG. 4, and the voltages and currents are negative, i.e., opposite polarity as compared to those of FIG. 4. Otherwise, operation in this mode is similar as described with reference to FIG. 4. There is an initial, downward (i.e., negative) spike in both supply voltage and supply current, from time T=zero, for the first few seconds of operation. In the region 506, constant current is applied up until about sixty seconds of time. The voltage falls slightly (i.e., magnitude increases slightly in a negative direction), from about −11 V to about −11½ V during this time, as seen in the region 502. In the constant current region 506, 502, the sense voltage is greater than a target sense voltage of 0 V, and the constant current source provides about −1½ A (amps) to the electrochromic device.

At time T=sixty seconds in FIG. 5, the sense voltage reaches the target sense voltage of 0 V, and the driver 100 switches from constant current to a variable voltage (or a variable current) to maintain the sense voltage at 0 V. In the region 504, the supply voltage is observed to increase from about −11½ V up to about −2½ V (decreasing in magnitude) over the next four minutes (e.g., from sixty seconds to three hundred seconds), as the sense voltage is maintained at a constant voltage equal to the target sense voltage (i.e., 0 V). In the region 508, the supply current is observed to increase from about −1.5 A up to about −0.2 A or −0.3 A (i.e., about −1½ A up to about −¼ A, a decrease in magnitude), again while maintaining the sense voltage at a constant voltage (of 0 V). At time T=three hundred seconds, the right end of the graph, the charge in the electrochromic device has reached the target charge Qtarget, and the driver 100 stops supplying the variable voltage (or the variable current) to the electrochromic device, i.e., the driver 100 stops supplying current or voltage to the electrochromic device. The four wire open circuit voltage process 204 and the check state of charge process 206 can then take place as described with reference to FIGS. 2 and 3. In other cases, the transfer of charge can be stopped after a set time duration elapses.

The graphs shown in FIGS. 4 and 5 apply to full charge and full discharge of the electrochromic device, respectively. Full charge achieves minimum transmissivity of the electrochromic device, and full discharge achieves maximum transmissivity of the electrochromic device in some embodiments. Partial charge or partial discharge of the electrochromic device achieves various intermediate amounts of transmissivity of the electrochromic device, and may have differing values of target charge and sense voltage, accordingly.

One example of a charge/discharge protocol for the electrochromic device is shown in Table 1 below, similarly to the actions shown in FIGS. 4 and 5. This protocol can be practiced using the system shown in FIG. 1, the processes shown in FIGS. 2 and 3, and the method discussed below in FIG. 8.

TABLE 1

Use CCCV (constant current-constant sense voltage) sourcing with 4 W sensing
Full Charge/Partial Charge/Partial Discharge:
Apply constant supply current
Measure sense voltage and supply current (count charge)
Stop step when Qsource = Qtarget
IF
sense voltage reaches Vlimit
THEN
switch to constant voltage mode.
Hold Vsns = Vlimit until Qsource = Qtarget.
Full Discharge:
Apply constant supply current
Measure sense voltage and supply current (count charge)
IF
sense voltage reaches 0 V
THEN
switch to constant voltage mode.
Hold Vsns = Vlimit until Qsource = Qtarget.

The above protocol applies a non-zero sense voltage limit for full charge, partial charge, and partial discharge, and a 0 V sense voltage limit for full discharge. In the full charge, partial charge and partial discharge, the constant supply current is stopped when the total amount of charge transferred to the electrochromic device reaches the target amount of charge to be in the electrochromic device, or when the sense voltage reaches the sense voltage limit, whichever comes first. If the sense voltage is reached, but the target amount of charge is not yet reached, the constant voltage mode applies a variable voltage to the electrochromic device and holds the sense voltage at the sense voltage limit (i.e., the constant voltage) until the target amount of charge is reached in the electrochromic device. In other cases, the constant current, variable voltage, and/or transfer of charge is stopped after a set time duration elapses. In another example, where the device is set to fully discharge, the sense voltage limit is 0 V, and this is held for a total of five minutes (or some other predetermined time span) while the variable voltage is applied. Constant current (to the electrochromic device) and constant voltage (of the sense voltage) are used, with four wire sensing in some embodiments. That is, there are four wires to the electrochromic device, two of which (attached to the bus bars) are used for supplying current and voltage, and two of which (attached to the sense voltage terminals) are used for the sense voltage. In full charge, partial charge, partial discharge, and full discharge, charge is counted by measuring the supply current (which is integrated over time, or discreetly summed as a digital approximation of an integral over time). The charge count is related to how much charge (i.e., electrons) is transferred to the electrochromic device over time through one of the bus bars, and is applied to the determination of whether the total amount of charge transferred to the electrochromic device has reached a target amount of charge. In other cases, the transfer of charge is stopped after a set time duration elapses. The term "constant current-constant voltage" sourcing, refers to having two stages or phases applied to rapid transmissivity change, namely a first stage of applying constant current to the electrochromic device 118, and a second stage of maintaining constant sense voltage of the electrochromic device 118.

FIG. 6 is a circuit diagram of a power supply and voltage sensing circuit, which are suitable for use in the driver 100 of FIG. 1 to charge and discharge the electrochromic device in some embodiments. The circuit applies pulse width modulation (PWM) from a microcontroller unit (MCU) to drive high output buffers 602, 604, which supply power (i.e., voltage and current) to the electrochromic device. Voltage across selected terminals of the electrochromic device is input to various differential amplifiers 606, 608, 610, the outputs of which are sent to an analog-to-digital converter of the microcontroller unit. Gains of the differential amplifiers 606, 608, 610 could be unity gains. Alternatively, a gain and/or an offset could be selected in order to match with a range of the analog-to-digital converter inputs. A pulse width modulation output 612 from the microcontroller unit is an input to a first non-inverting buffer 602, and is an input to an inverter 630, the output of which drives a second non-inverting buffer 604. The output of the first non-inverting buffer 602 connects to a first terminal of a resistor 620, and the second terminal of the resistor 620 connects to the VSOURCE+ terminal 622 of the power supply. The VSOURCE+ terminal 622 can be connected to the VSOURCE+ terminal (e.g., one of the bus bars 120) of the electrochromic device 118 depicted in FIG. 1.

Continuing with FIG. 6, the output of the second non-inverting buffer 604 connects to the VSOURCE− terminal 628 of the power supply. The VSOURCE− terminal 628 can be connected to the VSOURCE− terminal (e.g., another one of the bus bars 120) of the electrochromic device 118 of FIG. 1. Applying a pulse width modulation signal as the pulse width modulation output 612 from the microcontroller unit results in the first non-inverting buffer 602 and the second non-inverting buffer 604 producing complementary rail to rail outputs of a controlled pulse width. In some embodiments, the large amount of capacitance of the electrochromic device reduces the amplitude of the modulated outputs of the first non-inverting buffer 602 and the second non-inverting buffer 604, so that a DC voltage of a controllable amplitude and polarity is produced across the bus bars of the electrochromic device. The voltage may have some voltage ripple in some embodiments. The use of pulse width modulation to produce a DC voltage may be related to how pulse width modulation is applied to a capacitive load in switching power supplies.

The VSNS+ terminal 624 of the circuit of FIG. 6 can be connected to the VSNS+ terminal 124 of the electrochromic device 118, and the VSNS− terminal 626 can be connected to the VSNS− terminal 126 of the electrochromic device 118. The voltage across the VSNS+ terminal 624 and the VSNS− terminal 626 is input to the first differential amplifier 606, the output of which is a first analog-to-digital converter input 614. By this path, the analog-to-digital converter can measure the sense voltage of the electrochromic device. Referring back to FIG. 1, this is one embodiment of the voltmeter. Measurement of the sense voltage is applied in the so-called constant voltage control, in which the voltage or current to the electrochromic device is controlled so as to maintain a constant sense voltage. In this embodiment, the duty cycle of the pulse width modulation output 612 is controlled by a microcontroller unit, and varied while monitoring the sense voltage.

The VSOURCE+ terminal 622 and the VSOURCE− terminal 628 of FIG. 6 are connected as inputs to the second differential amplifier 608, the output of which is a second analog-to-digital converter input 616. By this path, the analog-to-digital converter can measure the voltage across the bus bars of the electrochromic device, and determine the voltage applied to the electrochromic device. This information can be used by the microcontroller to monitor the voltage that is applied across the bus bars 120 of the electrochromic device 118 of FIG. 1. In one embodiment, the microcontroller monitors the voltage and adjusts the pulse width modulation as described above to provide the constant current supply, the variable voltage supply and/or the variable current supply, with the selected polarity. The voltage (i.e., electrical potential) between the VSOURCE+ and VSOURCE− terminals, or between the VSOURCE+ and another terminal, or between the VSOURCE− and another terminal, can also have voltage limits. Similarly to the Vsns voltage limits, if one of these VSOURCE voltage limits are reached during the application of a constant current, then a variable current mode can be initiated to maintain the VSOURCE voltage at, or below, the voltage limit.

Opposed terminals of the resistor 620 of FIG. 6 are connected as inputs to a third differential amplifier 610, the output of which is a third analog-to-digital converter input 618. By this path, the analog-to-digital converter can measure voltage across the resistor 620. With the value of the resistor 620 and the voltage across the resistor 620, the microcontroller unit can calculate the current through the resistor 620, which is also the current into the electrochromic device. Referring back to FIG. 1, this is one embodiment of the ammeter. The microcontroller can thus monitor the current as to both magnitude and polarity, and adjust the pulse width modulation as described above. The value of the current can also be used for calculating the total amount of charge that has been transferred into the electrochromic device, for example by repeatedly summing digitally converted values of the current over a span of time, in some embodiments.

FIG. 7 is a circuit diagram of a further power supply and voltage sensing circuit, which are suitable for use in the driver 100 of FIG. 1 to sequester charge in the electrochromic device in some embodiments. The circuitry is similar in principle and operation to that shown in FIG. 6, but with connections appropriate to charge sequestration. In FIG. 7, a further pulse width modulation output 712 from the microcontroller unit is an input to a third non-inverting buffer 702, and is an input to a further inverter 706, the output of which drives a fourth non-inverting buffer 704. The output of the third non-inverting buffer 702 connects to a first terminal of a resistor 718, and the second terminal of the resistor 718 connects to the SEQ+ terminal 720 of the power supply. The SEQ+ terminal 720 can be connected to the charge sequestration terminal 122 (labeled SEQ in FIG. 1) of the electrochromic device 118.

The output of the fourth non-inverting buffer 704 of FIG. 7 connects to the VSOURCE− terminal 628 of the power supply. The VSOURCE− terminal 628 can be connected to the VSOURCE− terminal (e.g., one of the bus bars 120) of the electrochromic device 118 of FIG. 1. Applying a pulse width modulation signal as the pulse width modulation output 712 from the microcontroller unit results in the third non-inverting buffer 702 and the fourth non-inverting buffer 704 producing complementary rail to rail outputs of a controlled pulse width. As similarly described above, this produces a DC voltage of a controllable amplitude and polarity, which may have some ripple voltage, across the charge sequestration terminal 122 and one of the bus bars 120 of the electrochromic device 118 of FIG. 1. In various further embodiments, the output of the fourth non-inverting buffer 704 can be connected to the VSOURCE+ terminal of the electrochromic device. In the above embodiments, the power supply depicted in FIG. 7 can transfer charge between the selected bus bar 120 of the electrochromic device 118 and the charge sequestration terminal 122, which sequesters charge from the electrochromic device 118 of FIG. 1.

Still referring to FIG. 7, the SEQ+ terminal 720 and the VSOURCE− terminal 628 are connected as inputs to the fourth differential amplifier 708, the output of which is a fourth analog-to-digital converter input 714. By this path, the analog-to-digital converter can measure the voltage across the charge sequestration terminal 122 and the selected one of the bus bars 120 of the electrochromic device 118 of FIG. 1, and determine the voltage applied for charge sequestration. In one embodiment, the microcontroller monitors the voltage thusly, and adjusts the pulse width modulation as described above to provide a constant current supply, a variable voltage supply and/or a variable current supply, with a selected polarity. Opposed terminals of the resistor 718 are connected as inputs to a fifth differential amplifier 710, the output of which is a fifth analog-to-digital converter input 716. By this path, the analog-to-digital converter can measure voltage across the resistor 718. With the values of the resistor 718 and the voltage across the resistor 718, the microcontroller unit can calculate the current through the resistor 718, which is also the current into the charge sequestration terminal 122 of the electrochromic device 118 of FIG. 1. The microcontroller is able to monitor this current as to both magnitude and polarity, and adjust the pulse width modulation as described above. The value of the current can also be used for calculating the total amount of charge that has been transferred for sequestration, for example by repeatedly summing values of the current in some embodiments. The voltage (i.e., electrical potential) between the SEQ+ terminal and VSOURCE− or another terminal, can also have voltage limits. Similarly to the Vsns voltage limits, if one of these SEQ voltage limits are reached during the application of a constants sequestration current, then a variable current mode can be initiated to maintain the SEQ voltage at, or below, the voltage limit.

Figure 8A:
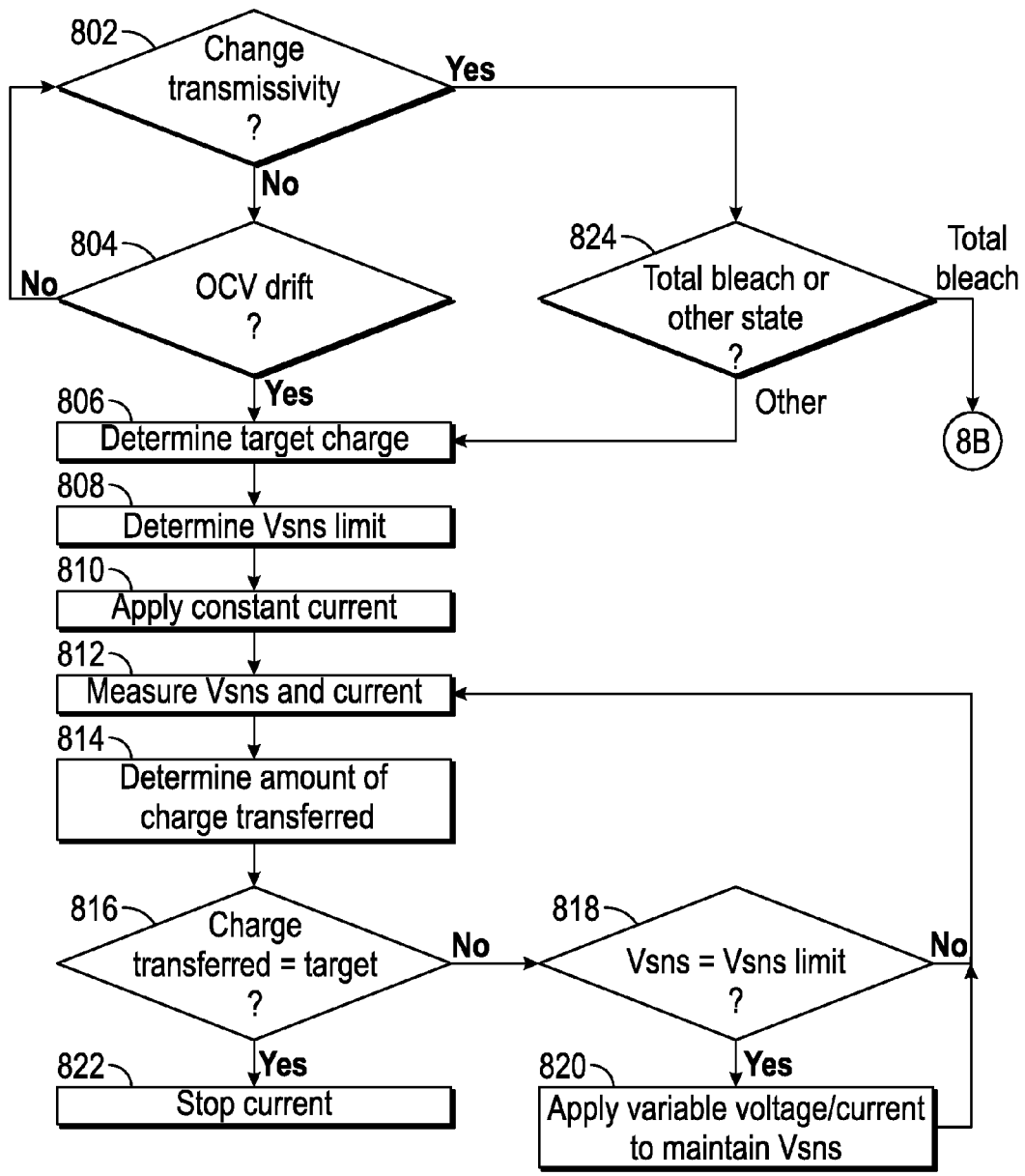
FIG. 8*a* is a flow diagram of a method for controlling an electrochromic device, which can be practiced using the system of FIG. 1.
Figure 8B:
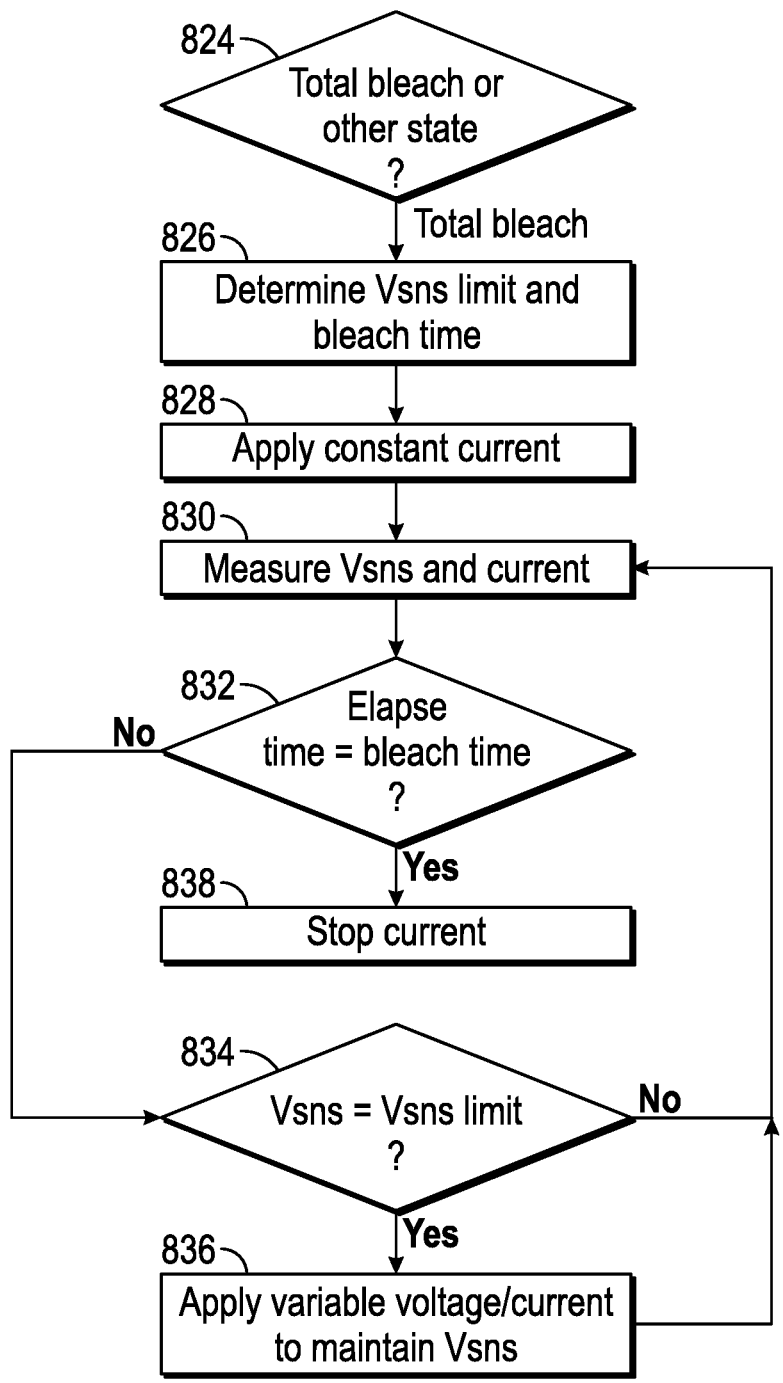
FIG. 8*b* is a flow diagram of a method for controlling an electrochromic device, which can be practiced using the system of FIG. 1.
Figure 8C:
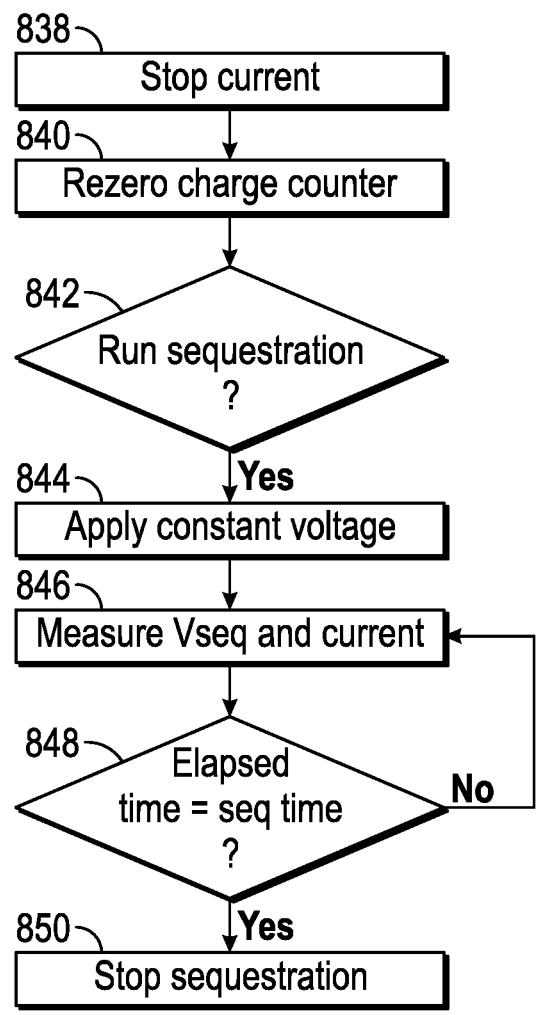
FIG. 8*c* is a flow diagram of a method for controlling an electrochromic device, which can be practiced using the system of FIG. 1.

FIGS. 8a, 8b, and 8c are flow diagrams of a method for controlling an electrochromic device, which can be practiced using the system of FIG. 1 in some embodiments. More specifically, the method can be practiced on or by the driver or the supply control module of FIG. 1, or by a processor such as a microprocessor or a digital signal processor in a control system. In a decision action 802, it is determined whether to change the transmissivity of an electrochromic device. This determination could be based on user input, user schedule, sensor input, rules, artificial intelligence, etc. If the answer is yes, i.e., to change the transmissivity, flow proceeds to the action 824, and if the answer is no, i.e., to not change the transmissivity, flow proceeds to the decision action 804.

In decision action 804, it is determined whether there is open circuit voltage drift in the electrochromic device. For example, while waiting for indication from a user or a user device, a controller or driver could be checking open circuit voltage across sense voltage terminals of the electrochromic device to determine if the open circuit voltage changes beyond an acceptable amount of drift over time. If the answer is no, there is no drift (i.e., the amount of drift is within an acceptable range), flow branches back to the decision action 802. The controller or driver can loop through the decision actions 802, 804, looking for a decision or reason to change the transmissivity of the electrochromic device. If the answer is yes in decision action 804, there is drift, flow branches to the action 806.

In decision action 824, it is determined if the transmissivity change will be to the total bleach state, or to another state, such as darkened or an intermediate state. If the answer to decision action 824 is to change the transmissivity to a state other than a total bleach state, then the flow also branches to action 806.

Action 806 of FIG. 8a is entered when there is a decision to change the transmissivity of the electrochromic device, whether this is deliberate on behalf of a user, or due to drift. In action 806, a target charge to be transferred to the electrochromic device is determined. The target charge can be based on the tracked total amount of charge transferred to the electrochromic device and a difference between a tracked transmissivity level and a desired transmissivity level of the electrochromic device, in the case of an action performed on behalf of a user in some embodiments. Alternatively, the target charge is based on restoring the originally targeted total amount of charge on the electrochromic device in the case of drift. A sense voltage limit is determined, in action 808. The sense voltage limit is greater than 0 V in magnitude, and of appropriate polarity relative to terminals of the electrochromic device, in the case of charging the electrochromic device to decrease transmissivity. The sense voltage limit is 0 V, in the case of fully discharging the electrochromic device, which is in some embodiments to maximum transmissivity. The sense voltage limit is intermediate in the case of partial charge or partial discharge. Further, the sense voltage limit is set at a safe value, e.g., according to a table, a parameter or a calculation, so as to protect the electrochromic device from deterioration as a result of too much current or voltage. The actions 806 and 808 can be performed in either order, in various embodiments.

Still referring to FIG. 8a, constant supply current is applied to the electrochromic device, in an action 810. The appropriate polarity for the current should be selected, according to whether the electrochromic device is being charged or discharged. The sense voltage and the supply current are measured, in an action 812. For example, the sense voltage can be measured across sense voltage terminals of the electrochromic device, using analog-to-digital conversion. The supply current can be measured by measuring the voltage across an in-line resistor coupled to one of the bus bars of the electrochromic device.

Following action 812, the amount of charge transferred to the electrochromic device is determined in an action 814. The charge transferred to the electrochromic device can be determined by integrating the current supply to the electrochromic device over time in various embodiments. Analog or digital integration techniques can be applied. In a decision action 816 of FIG. 8a, it is determined whether the charge transferred to the electrochromic device equals the target amount of charge to be transferred. If the answer is yes, the charge transferred equals the amount of charge to be transferred, i.e., the target amount of charge has been transferred, then the flow branches to the action 822 and the current (and the voltage) application to the electrochromic device is stopped. Flow then proceeds back to the decision action 802, in order to loop while waiting for a determination to charge or discharge the electrochromic device, and check for drift.

If the answer in decision action 816 is no, flow branches to decision action 818, where it is determined whether the sense voltage reaches the sense voltage limit. For example, the sense voltage has not yet reached the sense voltage limit if the sense voltage is less than an upper sense voltage limit in the case of charging, or the sense voltage is greater than a lower sense voltage limit in the case of discharging. If the sense voltage has not yet reached the sense voltage limit, the answer to the decision action 818 is no, and flow branches to the action 812, in order to continue looping, measuring the sense voltage and the supply current and determining whether the total amount of charge has yet been transferred. If the sense voltage has reached the sense voltage limit, the answer to the decision action 818 is yes, and flow branches to the action 820.

In the action 820 of FIG. 8a, the constant current 810 is stopped, and a variable voltage or a variable current is supplied to the bus bars of the electrochromic device, to maintain the sense voltage (at the sense voltage terminals of the electrochromic device) at the sense voltage limit. This involves ceasing the constant current, and changing to the variable operation of the power supply. For example, the voltage or the current of a power supply is adjusted while the sense voltage is monitored, and adjustments are made accordingly, e.g., by a driver or a controller such as the supply control module of FIG. 1. As a further example, the pulse width modulation applied by a microcontroller to the output buffers in the power supply and voltage sensing circuit of FIG. 6 is adjusted by the microcontroller, to maintain a constant sense voltage. The process then returns to action 812, where the sense voltage and current are monitored, 814, where the amount of charge transferred is determined, and to the decision action 816. Once the charge transferred equals the target charge, the answer to decision action 816 is yes, and the flow branches to action 822, where the current (and voltage) stops.

In variations of the method, the decision actions 816 and 818 could be split or rearranged or performed at other times during the flow. Various further variations of the method are readily devised in keeping with the teachings herein.

In other variations, the decision action at 816 could be based on an elapsed time rather than a target amount of charge transferred.

Returning to decision action 824, if it is determined that the transmissivity change will be towards a total bleach state, then flow proceeds to the action 826, in FIG. 8b. In action 826, the sense voltage limit is determined, and a bleach time is also determined. The sense voltage limit is 0 V, in the case of fully discharging the electrochromic device, which is in some embodiments to maximum transmissivity. Again, constant supply current is applied to the electrochromic device, in an action 828, and the sense voltage and the supply current are measured, in an action 830. The flow next proceeds to decision action 832, where it is determined if the elapsed time of the constant current application has reached the bleach time determined in action 826. If the elapsed time has not reached the bleach time, then the flow branches to decision action 834. In some cases, the sense voltage will be held at zero volts and the constant current 828 or variable voltage/current 836 will be applied until the elapsed time reaches the predetermined duration.

In the decision action 834 of FIG. 8*b*, it is determined whether the sense voltage reaches the sense voltage limit. If the sense voltage has not yet reached the sense voltage limit, the answer to the decision action 834 is no, and flow branches to the action 830 in order to continue looping, measuring the sense voltage and the supply current and determining whether the elapsed time has reached the bleach time in decision action 832. If the sense voltage has reached the sense voltage limit, the answer to the decision action 834 is yes, and flow branches to the action 836.

In the action 836 of FIG. 8*b*, the constant current 828 is stopped, and a variable voltage or a variable current is supplied to the bus bars of the electrochromic device, to maintain the sense voltage (at the sense voltage terminals of the electrochromic device) at the sense voltage limit. This involves ceasing the constant current, and changing to the variable operation of the power supply. For example, the voltage or the current of a power supply is adjusted while the sense voltage is monitored, and adjustments are made accordingly, e.g., by a driver or a controller such as the supply control module of FIG. 1. As a further example, the pulse width modulation applied by a microcontroller to the output buffers in the power supply and voltage sensing circuit of FIG. 6 is adjusted by the microcontroller, to maintain a constant sense voltage. The process then branches back to action 830, where the sense voltage and current are monitored, and decision action 832.

Once the elapsed time reaches the bleach time, the answer to decision action 832 is yes, and the flow branches to action 838, where the current (and voltage) stops.

In variations of the method, the decision actions 832 and 834 could be split or rearranged or performed at other times during the flow. Various further variations of the method are readily devised in keeping with the teachings herein.

In some cases, the constant current supplied to the device to switch it to the total bleach state will be stopped 838 of FIG. 8*b* after a trigger other than time duration. For example, the constant current could be stopped after a certain target amount of charge is transferred. Another example criteria for stopping the constant current is a determination that a particular voltage limit is measured. For instance, the constant current could be stopped when the magnitude (i.e. the absolute value) of the sense voltage is less than a certain value, such as less than 1 V, or less than 0.1 V, or less than 0.05 V, or less than 100 mV, or less than 50 mV, or less than 10 mV.

In some embodiments, the total bleach state corresponds to a fully discharged device, and after action 838 (where the bleach time has elapsed and the current is stopped), the process flow proceeds to action 840 of FIG. 8*c* where the charge counter is re-zeroed.

In some cases, re-zeroing the charge counter 840 is initiated when the sense voltage is held at zero volts, or when the sense voltage is less than a certain value, such as less than 100 mV, or less than 50 mV, or less than 10 mV, or less than 1 mV, or less than 0.1 mV, or less than 0.01 mV, or less than 0.001 mV.

In some electrochromic devices, it is advantageous to perform sequestration when the device is in the total bleached state. Therefore, in some cases, after the charge counter is re-zeroed, the flow can proceed to decision action 842 of FIG. 8*c*. In decision action 842, it is determined if sequestration should be run. If the answer is no, then the flow can branch back to decision action 802. If the answer is yes to run sequestration, then the flow proceeds to action 844.

The decision to run sequestration could be based on any number of conditions such as a set time schedule (e.g., once per day), state of the electrochromic device (e.g., total bleach), electrical measurement (e.g., sense voltage magnitude less than a pre-set limit), or any combination of conditions. For instance, the decision to run sequestration could be based on the combination of when the device is in the total bleach state (e.g., after action 838), and if more than 2 hours have elapsed since the previous sequestration cycle. Another example could be after every total bleach cycle is completed (e.g., after action 838). Another example could be every time the sense voltage magnitude is less than 0.1 V, and no other cycle is running (e.g., the answer to 816, 818, 832 or 834 is no).

In other variations of the method, decision action 842 of FIG. 8*c* can be performed at other times during the flow, such as after 804, 830, or 838, in keeping with the teaching herein.

When sequestration is run, flow proceeds to action 844, where a constant voltage is supplied with the sequestration terminal. For example, a constant voltage can be applied between the sequestration terminal (e.g., 122 in FIG. 1) and one of the bus bars (e.g. 120 in FIG. 1). By way of further example, a constant voltage can be applied between the sequestration terminal (e.g., 720 in FIG. 7) and the VSOURCE− terminal of the power supply (e.g., 628 in FIG. 7). As the constant voltage is being applied, the flow proceeds to action 846, where the sequestration voltage (i.e. Vseq) and the current is monitored.

In decision action 848, it is determined if the constant voltage has been applied for a time duration equal to a pre-set sequestration time. If the elapsed time of the sequestration has not been met, then flow branches back to 846, and the sequestration voltage (i.e. Vseq) and the current continues to be monitored. If the elapsed time of the sequestration has been met, then the flow proceeds to action 850, and the sequestration voltage is stopped. After action 850, flow braches back to 802. In some cases, the sequestration will be stopped after a trigger other than time duration. For example, the constant voltage in action 844 could be stopped after a certain target amount of charge is transferred, or upon the determination that a particular voltage limit is measured.

In other embodiments, the sequestration could be accomplished by applying a constant current to the sequestration terminal rather than a constant voltage, or by applying a variable voltage/current based on a measured current or voltage limit. For instance, a sense voltage terminal could be added to the sequestration element, and that be used to independently monitor the local voltage at different locations within the sequestration element.

Figure 9:
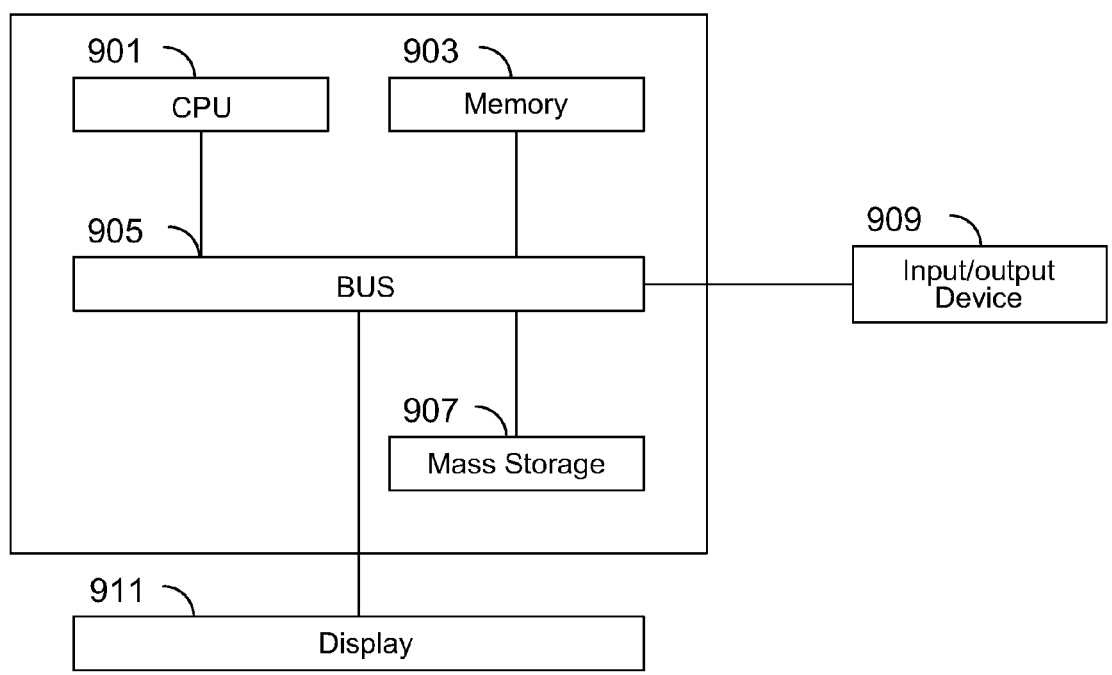
FIG. 9 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 9 is an illustration showing an exemplary computing device which may implement the embodiments described herein. The computing device of FIG. 9 may be used to perform embodiments of the functionality for controlling an electrochromic device in accordance with some embodiments. The computing device includes a central processing unit (CPU) 901, which is coupled through a bus 905 to a memory 903, and mass storage device 907. Mass storage device 907 represents a persistent data storage device such as a disc drive, which may be local or remote in some embodiments. The mass storage device 907 could implement a backup storage, in some embodiments. Memory 903 may include read only memory, random access memory, etc. Applications resident on the computing device may be stored on or accessed via a computer readable medium such as memory 903 or mass storage device 907 in some embodiments. Applications may also be in the form of modulated electronic signals modulated accessed via a network modem or other network interface of the computing device. It should be appreciated that CPU 901 may be embodied in a general-purpose processor, a special purpose processor, or a specially programmed logic device in some embodiments.

Display 911 is in communication with CPU 901, memory 903, and mass storage device 907, through bus 905. Display 911 is configured to display any visualization tools or reports associated with the system described herein. Input/output device 909 is coupled to bus 905 in order to communicate information in command selections to CPU 901. It should be appreciated that data to and from external devices may be communicated through the input/output device 909. CPU 901 can be defined to execute the functionality described herein, for instance to enable the functionality described with reference to FIGS. 1-8. The code embodying this functionality may be stored within memory 903 or mass storage device 907 for execution by a processor such as CPU 901 in some embodiments. The operating system on the computing device may be MS-WINDOWS™, UNIX™, LINUX™, iOS™ or other known operating systems. It should be appreciated that the embodiments described herein may be integrated with virtualized computing system also.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method for controlling an electrochromic device, comprising:
    applying a constant supply current to the electrochromic device;
    determining an amount of charge transferred to the electrochromic device, as a function of time and current supplied to the electrochromic device;
    ceasing the applying the constant supply current, responsive to a sense voltage reaching a sense voltage limit;
    applying one of a variable voltage or a variable current to the electrochromic device to maintain the sense voltage at the sense voltage limit, responsive to the sense voltage reaching the sense voltage limit; and
    terminating the applying the variable voltage or the variable current to the electrochromic device, responsive to the determined amount of charge reaching a target amount of charge.

2. The method of claim 1, wherein terminating occurs after reaching a desired transmissivity of the electrochromic device equating to the target amount of charge.

3. The method of claim 1, further comprising:
    measuring the sense voltage of the electrochromic device; and
    measuring the current supplied to the electrochromic device, wherein determining the amount of charge is based on summing digital values of the current over a span of time.

4. The method of claim 1, wherein determining the amount of charge transferred to the electrochromic device comprises:
    integrating, over time, the current supplied to the electrochromic device.

5. The method of claim 1, wherein once the amount of charge transferred equals the target amount of charge to be transferred the driver starts a four wire open circuit voltage process.

6. The method of claim 1, further comprising:
    reversing a polarity of a reversible constant current supply, wherein the reversible constant current supply applies the constant supply current with the reversed polarity to the electrochromic device;
    reversing a polarity of a reversible variable voltage supply, wherein the reversible variable voltage supply applies the variable voltage with the reversed polarity to the electrochromic device, and wherein the sense voltage limit is zero volts; and
    delaying the terminating for a predetermined amount of time during which the sense voltage is held at zero volts.

7. The method of claim 6, wherein the sense voltage is held at zero volts to rezero the driver as to the state of charge of the electrochromic device.

8. The method of claim 1, wherein determining the amount of charge transferred to the electrochromic device further comprises:
    applying analog to digital conversion to the current supplied to the electrochromic device, to produce a digital value of the current supplied to the electrochromic device; and
    adding values from a time series of the digital value of the current supplied to the electrochromic device.

9. The method of claim 1, wherein:
    the constant supply current is supplied to bus bars of the electrochromic device;
    the variable voltage or the variable current is supplied to the bus bars; and
    the sense voltage is measured from sense voltage terminals of the electrochromic device located elsewhere than the bus bars.

10. The method of claim 1 wherein the sense voltage is measured from an edge of the electrochromic device.

11. The method of claim 1, further comprising:
    monitoring the sense voltage; and
    applying one of a charge or a discharge to the electrochromic device, responsive to a deviation of the sense voltage, after a predetermined relaxation time, by more than a predetermined relaxation amount of voltage.

12. The method of claim 1 wherein if the state of charge does not match the target s a sequestration process is initiated.

23

13. The method of claim 1, wherein a sequestration process is initiated every time a fully bleached state is met.

14. An electronic driver for an electrochromic device, comprising:
- a power supply; and
- a power supply control module configured to perform actions comprising:
- supplying a constant current from the power supply to the electrochromic device;
- stopping the supplying the constant current when one of a sense voltage of the electrochromic device attains a sense voltage limit or an amount of charge transferred to the electrochromic device attains a target amount of charge; and
- controlling one of a variable voltage or a variable current from the power supply to the electrochromic device to maintain the sense voltage at the sense voltage limit while the amount of charge transferred to the electrochromic device is less than the target amount of charge.

15. The electronic driver of claim 14, further comprising at least one set of sense voltage terminals.

16. The electronic driver of claim 15, wherein the at least one set of sense voltage terminals is located elsewhere than a location of the bus bars.

17. The electronic driver of claim 15, wherein the at least one set of sense voltage terminals is connected to an interior region of the electrochromic device.

18. The electronic driver of claim 15, wherein the at least one set of sense voltage terminals is connected along an edge of the electrochromic device.

19. The electronic driver of claim 14, further comprising:
- the power supply arranged to reverse polarity via one of a relay, a solid-state switch or a multiple range operation of the power supply.

20. The electronic driver of claim 14, further comprising:
- an integrator module, coupled to the power supply module and arranged to integrate over time a current supplied to the electrochromic device, wherein the amount of charge transferred to the electrochromic device is based on an output of the integrator module.

21. The electronic driver of claim 14, further comprising:
- the power supply control module configured to control the variable voltage or the variable current from the power supply to the electrochromic device to hold the sense voltage at zero volts for a predetermined time span, for a full discharge of the electrochromic device.

22. The electronic driver of claim 14, further comprising:
- the power supply control module configured to monitor the sense voltage and configured to charge or discharge the electrochromic device when the sense voltage deviates after a predetermined relaxation time by more than a predetermined voltage.

23. The electronic driver of claim 14, further comprising:
- an analog-to-digital converter, coupled to the power supply control module and configured to couple to sense voltage terminals of the electrochromic device, the analog-to-digital converter arranged to produce a value of the sense voltage, wherein the sense voltage terminals are distinct from bus bars of the electrochromic device.

24. An electronic driver for an electrochromic device, comprising:
- a voltage detecting circuit configured to measure a sense voltage of sense voltage terminals of the electrochromic device;
- a reversible constant current supply configured to supply a constant current to the electrochromic device until one of the sense voltage achieves a sense voltage limit or an amount of charge transferred to the electrochromic device achieves a target amount of charge; and
- a reversible variable voltage supply configured to supply a variable voltage to the electrochromic device to keep the sense voltage at the sense voltage limit, responsive to the sense voltage achieving the sense voltage limit, until the elapsed time reaches a predetermined time duration.

25. The electronic driver of claim 24, wherein:
- the target amount of charge relates to a target transmissivity of the electrochromic device and relates to a first polarity for charging the electrochromic device or a second polarity for discharging the electrochromic device; and
- the sense voltage limit relates to the first polarity or the second polarity.

26. The electronic driver of claim 24, further comprising:
- the reversible constant current supply configured to supply a first constant current of a first polarity to the electrochromic device for charging the electrochromic device towards a first transmissivity and to supply a second constant current of a second polarity to the electrochromic device for discharging the electrochromic device towards a second transmissivity; and
- the reversible variable voltage supply configured to supply a first variable voltage of the first polarity to the electrochromic device for charging the electrochromic device towards the first transmissivity and to supply a second variable voltage of the second polarity to the electrochromic device for discharging the electrochromic device towards the second transmissivity.

27. The electronic driver of claim 24, further comprising:
- a digital signal processing unit configured to determine the amount of charge transferred to the electrochromic device as a time-series summation of values of a current supplied to the electrochromic device.

28. The electronic driver of claim 24, further comprising:
- a current sensing circuit coupled to the electrochromic device to produce at an output an analog value of a current supplied to the electrochromic device; and
- an analog integrator having as an input the output of the current sensing circuit, an output of the analog integrator relating to the amount of charge transferred to the electrochromic device.

29. The electronic driver of claim 24, wherein the reversible constant current supply and the reversible variable voltage supply are included in a power supply applying pulse width modulation for supplying the constant current, supplying the variable voltage, and reversing polarity.

30. The electronic driver of claim 24, further comprising:
- a power supply control module coupled to the voltage detecting circuit, the reversible constant current supply and the reversible variable voltage supply, the power supply control module configured to direct the reversible constant current supply and the reversible variable voltage supply; and
- the power supply control module configured to track a present amount of charge of the electrochromic device and configured to determine the target amount of charge to be transferred to the electrochromic device based on a difference between a present transmissivity of the electrochromic device and a target transmissivity of the electrochromic device.

* * * * *